(12) United States Patent
Steimle

(10) Patent No.: US 7,091,089 B2
(45) Date of Patent: Aug. 15, 2006

(54) METHOD OF FORMING A NANOCLUSTER CHARGE STORAGE DEVICE

(75) Inventor: Robert F. Steimle, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 210 days.

(21) Appl. No.: 10/876,805

(22) Filed: Jun. 25, 2004

(65) Prior Publication Data

US 2005/0287729 A1    Dec. 29, 2005

(51) Int. Cl.
*H01L 21/336* (2006.01)
(52) U.S. Cl. ............... 438/258; 438/962; 257/E21.689
(58) Field of Classification Search ........... 438/962
See application file for complete search history.

(56) References Cited

U.S. PATENT DOCUMENTS

| | | | |
|---|---|---|---|
| 6,297,095 B1 | 10/2001 | Muralidhar et al. | |
| 6,320,784 B1 | 11/2001 | Muralidhar et al. | |
| 6,339,002 B1 | 1/2002 | Chan et al. | |
| 6,444,545 B1 | 9/2002 | Sadd et al. | |
| 6,580,132 B1 | 6/2003 | Chan et al. | |
| 6,958,265 B1* | 10/2005 | Steimle et al. | 438/211 |
| 2004/0038492 A1* | 2/2004 | Okazaki et al. | 438/391 |
| 2004/0135204 A1 | 7/2004 | Wang et al. | |
| 2004/0212019 A1* | 10/2004 | Shinohara et al. | 257/368 |

OTHER PUBLICATIONS

Cavins et al., "A Nitride-Oxide Blocking Layer for Scaled SONOS Non-Volatile Memory," *Motorola, Inc.*, Jan. 10, 2002, 5 pages.
Cavins et al., "Integrated Stacked Gate Oxide and Interpoly Oxide," *Motorola, Inc.*, Nov. 1996, pp. 93-94.
Wolf, Ph.D., S.; "Endpoint-Detection in CMP"; Silicon Processing for the VLSI Era; Title pg & pp. 385-387; vol. 4: Deep Submicron Process Technology; Lattice Press, Sunset Beach, CA, no date.
Solomon, P.M. et al.; "Two Gates Are Better Than One"; IEEE Circuits & Devices Magazine; Jan., 2003; pp. 48-62; IEEE.
Blosse, A.; "PVD Aluminum Dual Damascene Interconnection: Yield Comparison between Counterbore and Self Aligned Approaches"; IITC; 1999; pp. 215-218; IEEE.

* cited by examiner

*Primary Examiner*—Chandra Chaudhari
(74) *Attorney, Agent, or Firm*—Robert L. King; Joanna G. Chiu

(57) ABSTRACT

In one embodiment, a method of forming a nanocluster charge storage device is provided. A first region of a semiconductor device is identified for locating one or more non-charge storage devices. A second region of the semiconductor device is identified for locating one or more charge storage devices. A gate oxide to be used as a gate insulator of the one or more non-charge storage devices is formed in the first region of the semiconductor device, and a nanocluster charge storage layer is subsequently formed in the second region of the semiconductor device. This may allow for improved integration of charge storage and non-charge storage devices. For example, since the nanoclusters are formed after formation of the gate oxide for the non-charge storage device, the nanoclusters are not exposed to an oxidizing ambient which could potentially reduce their size and increase the thickness of the underlying tunnel dielectric layer.

19 Claims, 14 Drawing Sheets

METHOD OF FORMING A NANOCLUSTER CHARGE STORAGE DEVICE

RELATED APPLICATION

This patent application is related to U.S. patent application Ser. No. 10/876,820, filed on even date, entitled "Method of Forming a Nanocluster Charge Storage Device," and assigned to the current assignee hereof.

FIELD OF THE INVENTION

The present invention relates to semiconductor devices, and, more particularly, to such devices having nanoclusters.

RELATED ART

Some devices such as memories (e.g. non volatile memories) utilize discrete charge storage elements called nanoclusters (e.g. of silicon, aluminum, gold, or germanium) for storing charge in a charge storage location of a transistor. In some examples, the nanoclusters are located between two dielectric layers, a bottom dielectric and a control dielectric. Examples of such transistors include thin film storage transistors. A memory typically includes an array of such transistors. Examples of nanocluster types includes doped and undoped semiconductor nanoclusters such as silicon nanoclusters, germanium nanoclusters and their alloys. Other examples of nanocluster types include various conductive structures such as metal nanoclusters (e.g., gold nanoclusters and aluminum nanoclusters), and metal alloy nanoclusters. In some examples, nanoclusters are from 10–100 Angstroms in size.

Some memories that have charge storage transistors with nanoclusters are implemented on integrated circuits that also include high voltage transistors in the circuitry used for charging and discharging the charge storage locations of the charge storage transistors. Charging or discharging the charge storage locations is used to store one or more bits of information, and may be referred to as programming or erasing. These high voltage transistors typically include a relatively thick gate oxide. The oxidation process used to grow the gate oxide may penetrate the control dielectric of the charge storage transistors thereby undesirably oxidizing the nanoclusters and undesirably increasing the bottom dielectric thickness. Accordingly, an improved method for making a device with nanoclusters is desirable.

BRIEF DESCRIPTION OF THE DRAWINGS

The present invention may be better understood, and its numerous objects, features, and advantages made apparent to those skilled in the art, by referencing the accompanying drawings.

DETAILED DESCRIPTION OF THE DRAWINGS

The following discussion is intended to provide a detailed description of at least one example of the invention and should not be taken to be limiting of the invention itself. Rather, any number of variations may fall within the scope of the invention which is properly defined in the claims following this description.

FIGS. 1–14 show partial side views of a semiconductor wafer during stages in the manufacture of a memory including nanoclusters according to a first embodiment of the present invention. As will be described later, the presently disclosed embodiment forms the relatively thick gate oxide of the high voltage transistors prior to formation of nanoclusters for the memory devices. In this manner, the nanoclusters are not affected during the formation of a high voltage transistor gate oxide. Such a technique may prevent oxidation of the nanoclusters while preserving thickness of the underlying tunnel dielectric.

Figure 1:
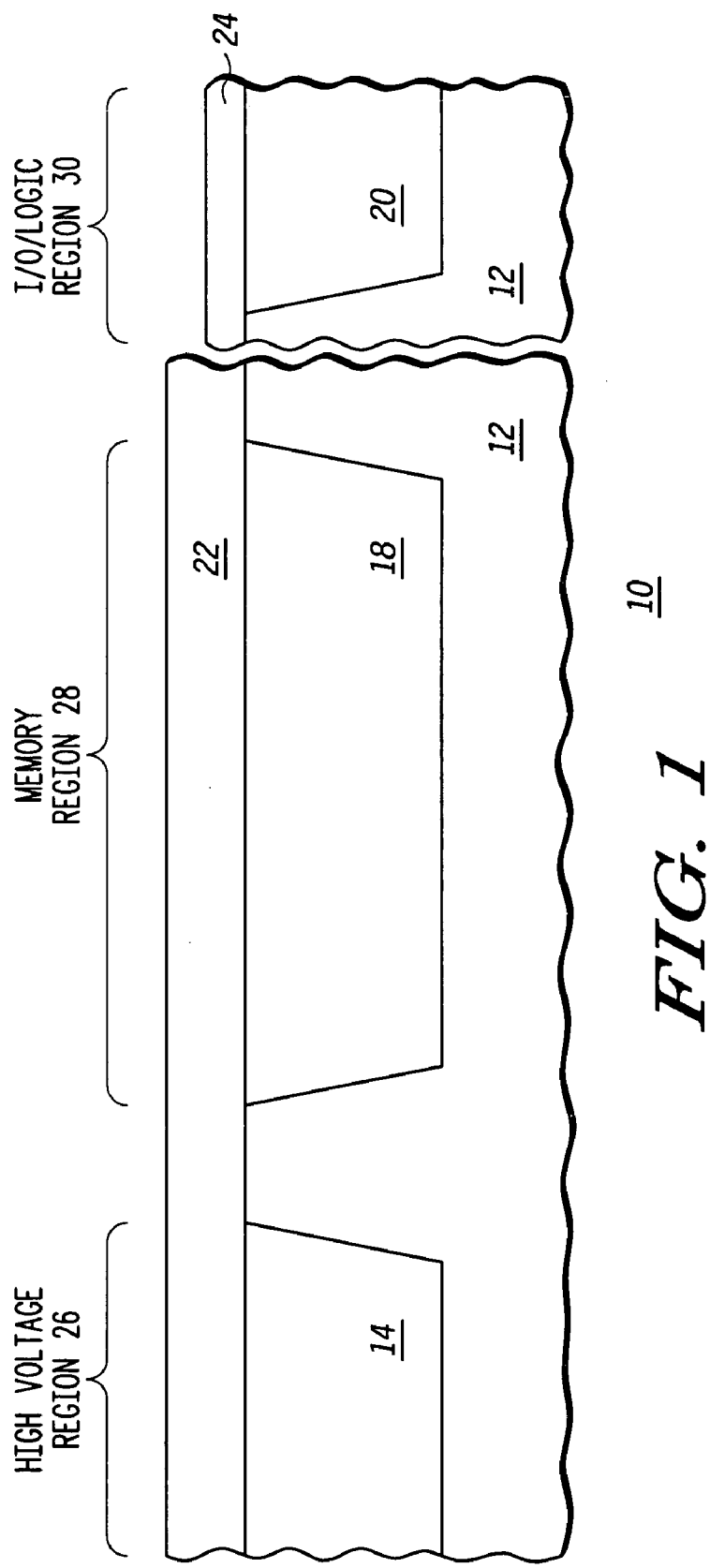
FIGS. 1–14 of the drawings illustrate a series of partial side views of a semiconductor device during various stages of manufacture of an integrated circuit according to an embodiment of the present invention. The use of the same reference symbols in different drawings indicates similar or identical items. Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

FIG. 1 shows a semiconductor device 10, in accordance with one embodiment of the present invention. Semiconductor device 10 may be a portion of an integrated circuit die. Semiconductor device 10 includes substrate 12 which is part of an overall wafer at the presently illustrated stage of manufacture. Substrate 12 may be any type of semiconductor substrate, such as, for example, a silicon substrate, silicon germanium substrate, germanium substrate, gallium arsenide substrate, or the like. Semiconductor device 10 also includes various dopant wells 14, 18 and 20 which form part of the functional circuitry of semiconductor device 10. Substrate also includes various pre-formed shallow trench isolation structures (not shown) to separate different devices and to laterally separate the wells discussed herein. Semiconductor device 10 may include various different device regions, such as a high voltage region 26 in which high voltage transistors may be formed, a memory region 28 in which memory transistors may be formed (such as, for example, non-volatile memory (NVM) transistors), and an input/output (I/O)/logic region 30 in which I/O transistors (which may be used in performing an I/O function) and/or logic transistors (which may be used in performing a logic function) may be formed. Note that in alternate embodiments, device 10 may include any number and type of device regions where the devices within the different regions may include different electrical properties.

In the illustrated embodiment, dopant well 14 is within high voltage region 26, dopant well 18 is within memory region 28, and dopant well 20 is within I/O/logic region 30. Note that dopant wells 14, 18, and 20 may take various forms. In one embodiment, well 18 forms part of storage cell circuitry of a memory array, such as, for example, non-volatile memory (NVM) array, and wells 14 and 20 form part of periphery circuitry including various types of periphery devices (such as high voltage, I/O, and/or logic devices). In the illustrated embodiment, well 18 is a p-well in which an array of storage cells will reside. Although in some contexts periphery devices include only high voltage (HV) devices (e.g., cell charge/discharge devices), in the embodiments discussed herein, periphery devices include various devices outside the memory array and may include HV devices, integrated circuit die input/output (I/O) devices, and low (LV) voltage devices (e.g., logic devices). In the illustrated embodiment, the periphery devices may reside in region 26 and/or region 30. Therefore, in one embodiment, region 28 is for the formation of charge storage devices and regions 26 and 30 is for the formation of non-charge storage devices. Well 14 within high voltage region 26 may form part of circuitry (e.g., high voltage transistors) for programming and erasing cells of the memory array. In the illustrated embodiment, well 14 is an n-well. Semiconductor device 10 may alternatively or additionally include an HV p-well within a deep n-type isolation well. In the illustrated embodiment, well 20 forms part of the I/O/logic circuitry of semiconductor device 10. The illustrated well 20 is an n-well. Semiconductor device may alternatively or additionally include a p-well within a deep n-type isolation well. In one embodiment, well 20 is a dual gate oxide (DGO) well.

Semiconductor device 10 also includes an HV transistor gate oxide layer 22 overlying substrate 12 within regions 26 and 28 and an I/O transistor gate oxide layer 24 overlying substrate 12 within region 30. Oxide layer 22 will be used to form gate stacks for high voltage transistors in region 26 and oxide layer 24 will be used to form gate stacks for I/O and/or logic devices in region 30. In one embodiment, HV transistor gate oxide layer 22 is a silicon dioxide layer. Alternatively, other dielectrics may be used for oxide layer 22 such as silicon oxynitride, hafnium oxide, aluminum oxide, lanthanum oxide, or lanthanum silicate. Oxide layer 22 may be formed over substrate 12, for example, by growing oxide (in an oxygen or steam environment) or by chemical vapor deposition (CVD). In one embodiment, oxide layer 22 has a thickness of at least 5 nanometers, but may be of other thicknesses in other embodiments. (Note that in one embodiment, oxide layer 22 may also be referred to as gate dielectric layer 22.) In one embodiment, I/O transistor gate oxide layer 24 is a silicon dioxide layer. Alternatively, other dielectrics may be used for oxide layer 24 such as silicon oxynitride, hafnium oxide, aluminum oxide, lanthanum oxide, or lanthanum silicate. In one embodiment, after formation of oxide layer 22, a patterned masking layer may be used to remove portions of oxide layer 22 in region 30 such that oxide layer 24 may be formed within region 30 by, for example, growing oxide (in an oxygen or steam environment) or by CVD. (Note that in one embodiment, oxide layer 24 may also be referred to as a gate dielectric layer or a gate insulator.) In the illustrated embodiment, oxide layer 24 is thinner than oxide layer 22, and may have a thickness, for example, of at least 2.5 nanometers, but may be of other thicknesses in other embodiments. In yet another embodiment, oxide layer 22 may be used within region 30 in place of oxide layer 24.

Note that conventional techniques may be used to form dopant wells 14, 18, and 20. Also, in one embodiment, dopant wells 14 and 20 may be formed prior to formation of oxide layers 22 and 24 while dopant well 18 may be formed after formation of oxide layers 22 and 24 (where the implants for dopant well 18 are performed through oxide layers 22 and 24). Alternatively, all of dopant wells 14, 18, and 20 may be formed prior to or after formation of oxide layers 22 and 24. Note also that in alternate embodiments, any number of wells may be present in each of regions 26, 28, and 30.

Figure 2:
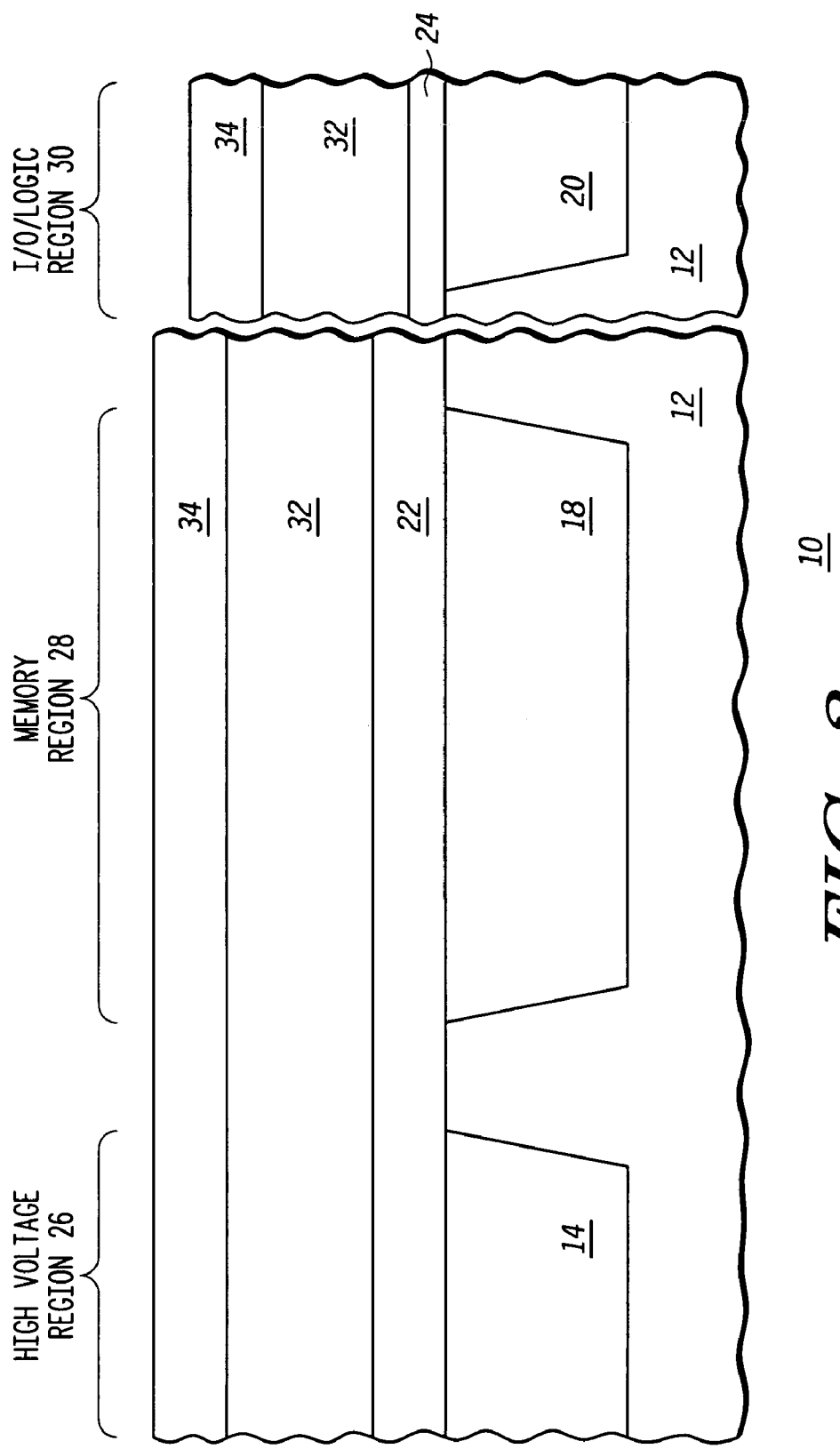

Referring to FIG. 2, a first gate electrode layer 32 (also referred to as a gate layer) is formed over oxide layer 22 and oxide layer 24. In one embodiment, first gate electrode layer 32 provides a bottom gate electrode layer for transistors within HV region 26 and I/O/logic region 30. In one embodiment, first gate electrode layer 32 includes polysilicon (also referred to as polycrystalline silicon). In alternate embodiments, first gate electrode layer 32 may include other materials which have work functions similar to those of doped polysilicon. Alternatively, first gate electrode layer 32 may be a metal. In one embodiment, first gate electrode layer 32 may be formed by CVD, and may have a thickness of at least 30 nanometers. Still referring to FIG. 2, after formation of first gate electrode layer 32, an oxidation barrier layer 34 is formed over first gate electrode layer 32. In one embodiment, oxidation barrier layer 34 includes nitride. Alternatively, oxidation barrier layer 34 may include silicon-rich nitride. In other embodiments, oxidation barrier layer 34 may therefore be formed of any material or materials which protects underlying layers during subsequent oxidation. In one embodiment, oxidation barrier layer 34 also provides an etch stop layer for use during subsequent etches, as will be described below. Therefore, oxidation barrier layer 34 may also be referred to as an etch stop layer or an oxidation barrier/etch stop layer. In another embodiment, multiple layers may be used in place of layer 34. In one embodiment, oxidation barrier layer 34 may be formed by CVD, and may have a thickness of at least 15 nanometers.

In one embodiment, first gate electrode layer 32 may be doped before or after formation of oxidation barrier layer 34. For example, in one embodiment, first gate electrode layer 32 may be doped differently within each of regions 26, 28, and 30. For example, in one embodiment, first gate electrode layer 32 is doped such that it results in a p-type material and an n-type material within each of regions 26 and 30, while remaining undoped in region 28. Note that conventional masking and doping techniques may be used to dope first gate electrode layer 32. In one embodiment, the doping of first gate electrode layer 32 may be used to obtain appropriate work functions and threshold voltages for the transistors formed in each of the regions. Alternatively, other doping or no doping may be performed within any of the regions.

Figure 3:
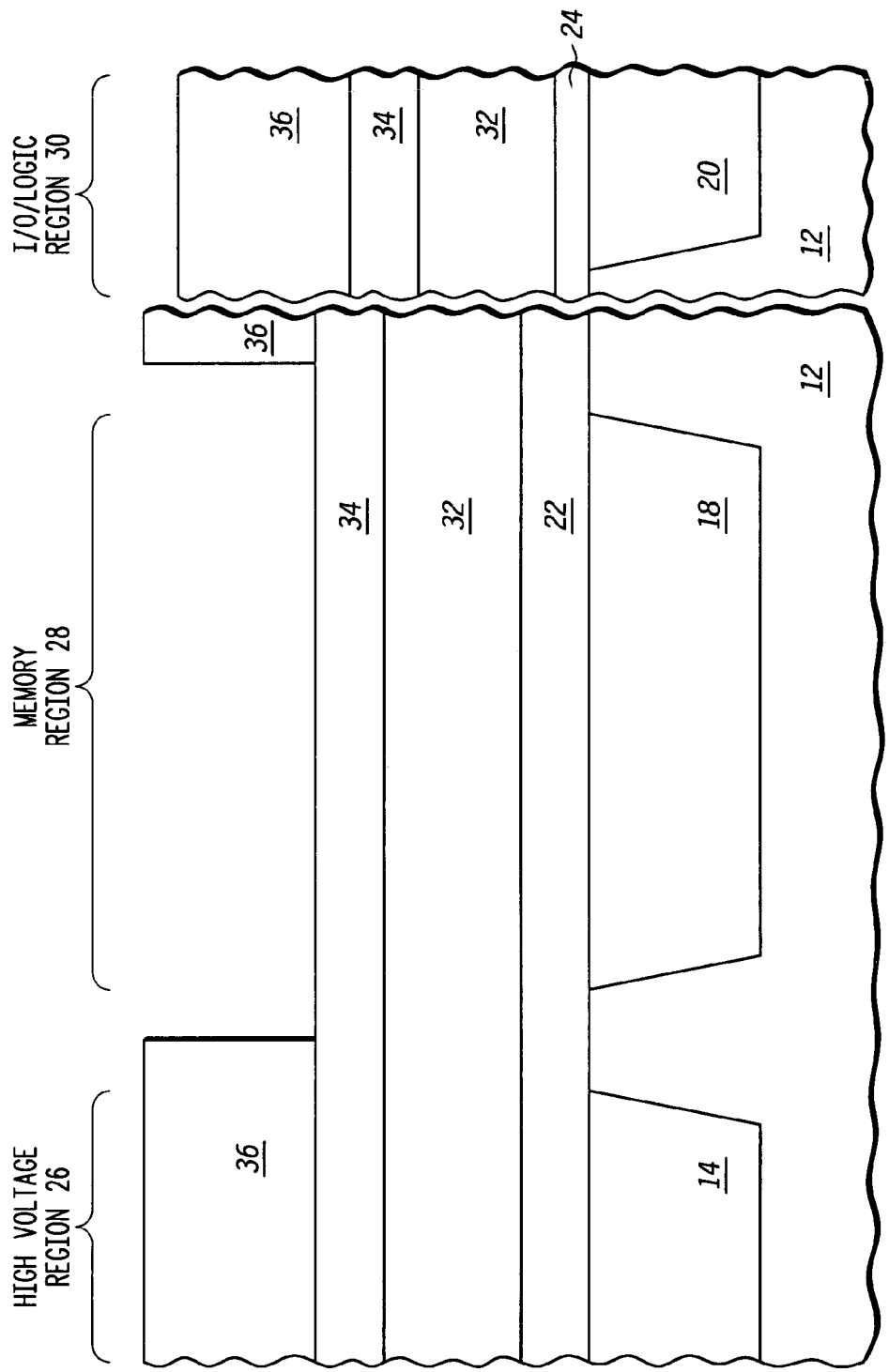
Figure 4:
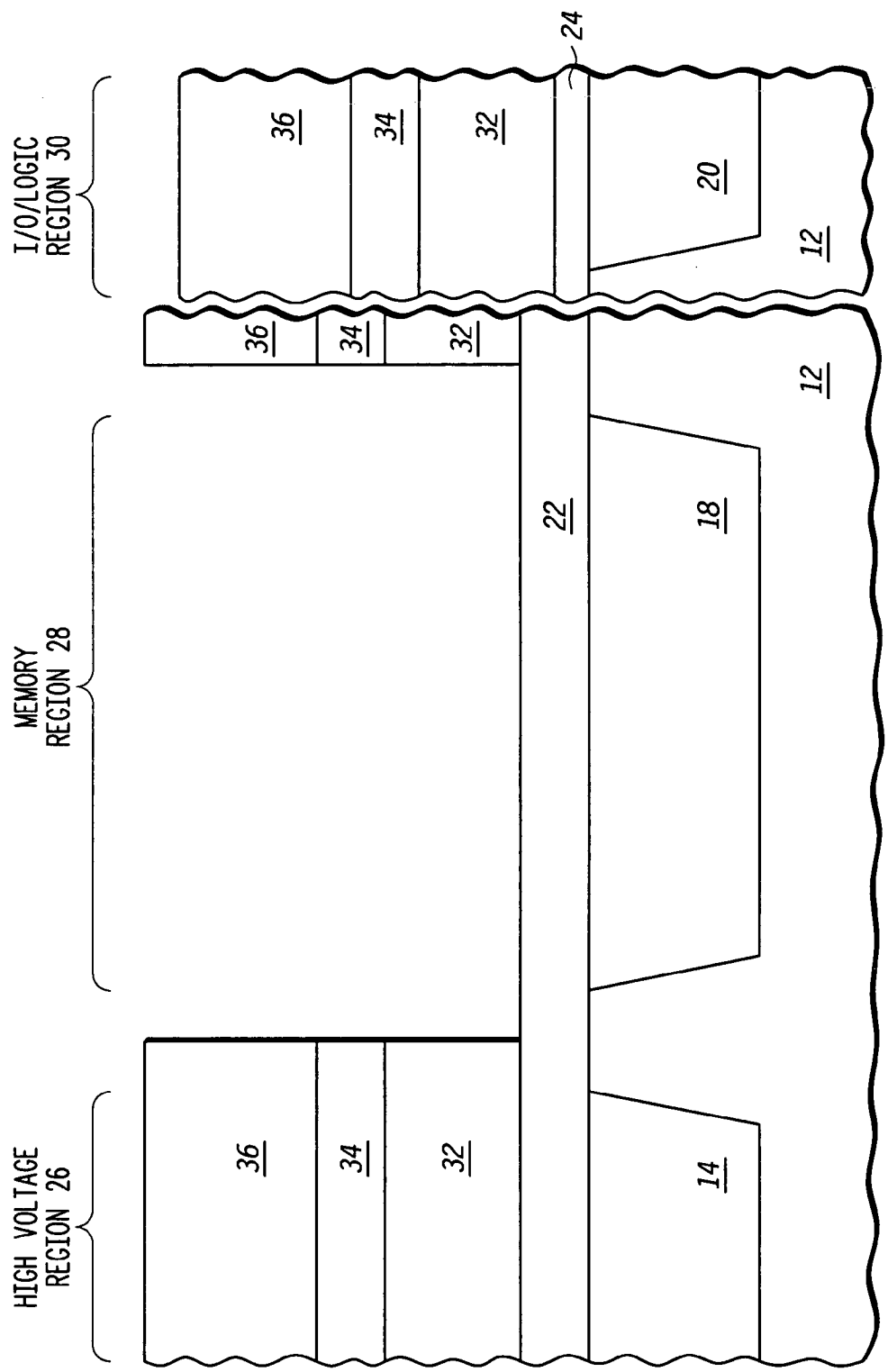

Referring to FIG. 3, a patterned masking layer 36 is formed over oxidation barrier layer 34 which defines an opening within memory region 28 such that substrate 12 within memory region 28 can be exposed. In one embodiment, patterned masking layer 36 includes photoresist. Referring to FIG. 4, portions of oxidation barrier layer 34 exposed by patterned masking layer 36 are removed, and subsequently, portions of first gate electrode layer 32 exposed by patterned masking layer 36 are removed. In one embodiment, portions of oxidation barrier layer 34 and first gate electrode layer 32 are removed using a same etch process. Alternatively, different etch chemistries may be used to remove each of oxidation barrier layer 34 and first gate electrode layer 32. In one embodiment, a dry etch is used to remove oxidation barrier layer 34 and first gate electrode layer 32.

Figure 5:
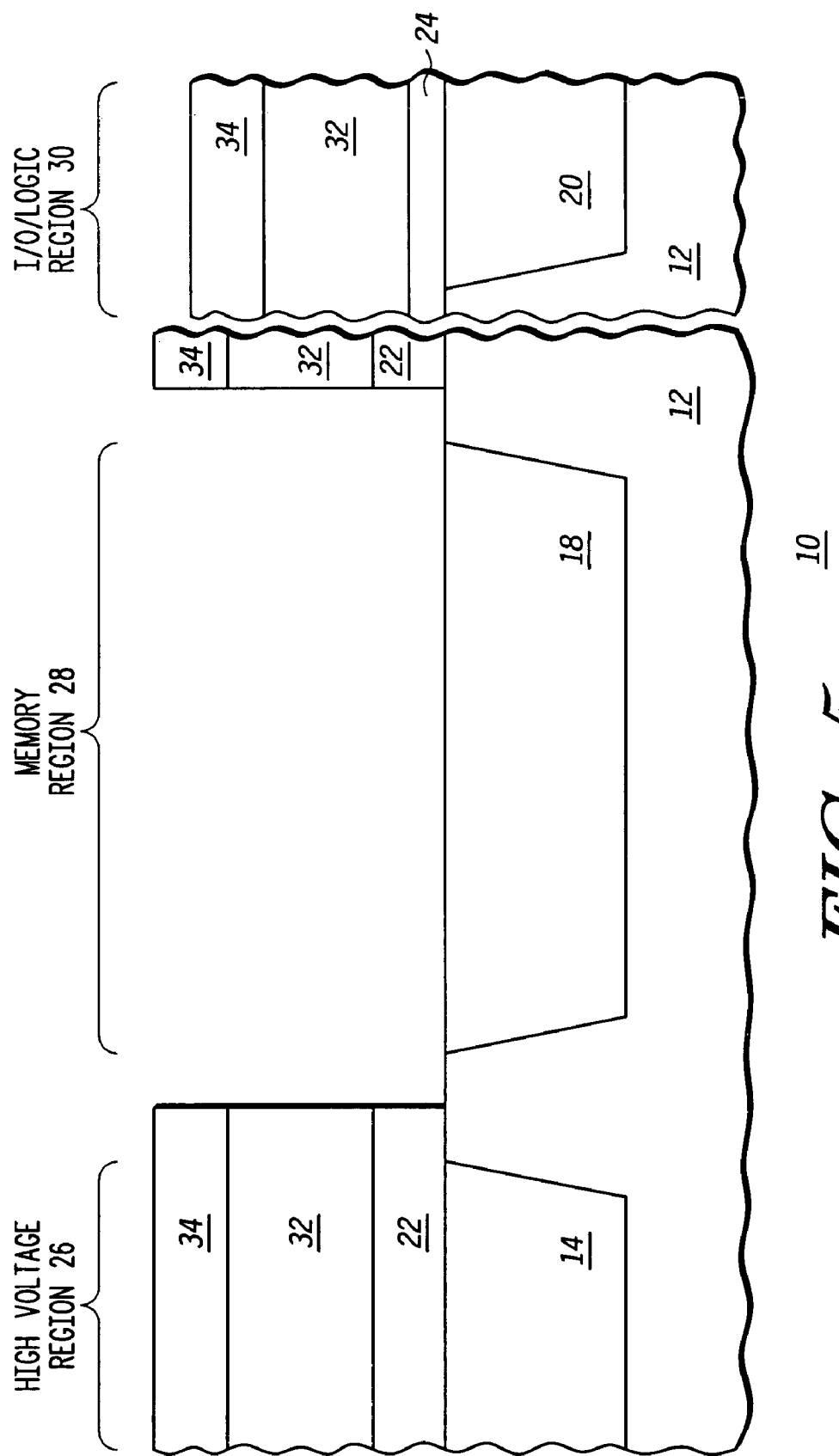

Referring to FIG. 5, portions of oxide layer 22 exposed by patterned masking layer 36 are removed. In one embodiment, the portions of oxide layer 22 are removed using a wet etch. Following the wet etch, patterned masking layer 36 is removed. Patterned masking layer 36 may also be removed using a wet etch.

Figure 6:
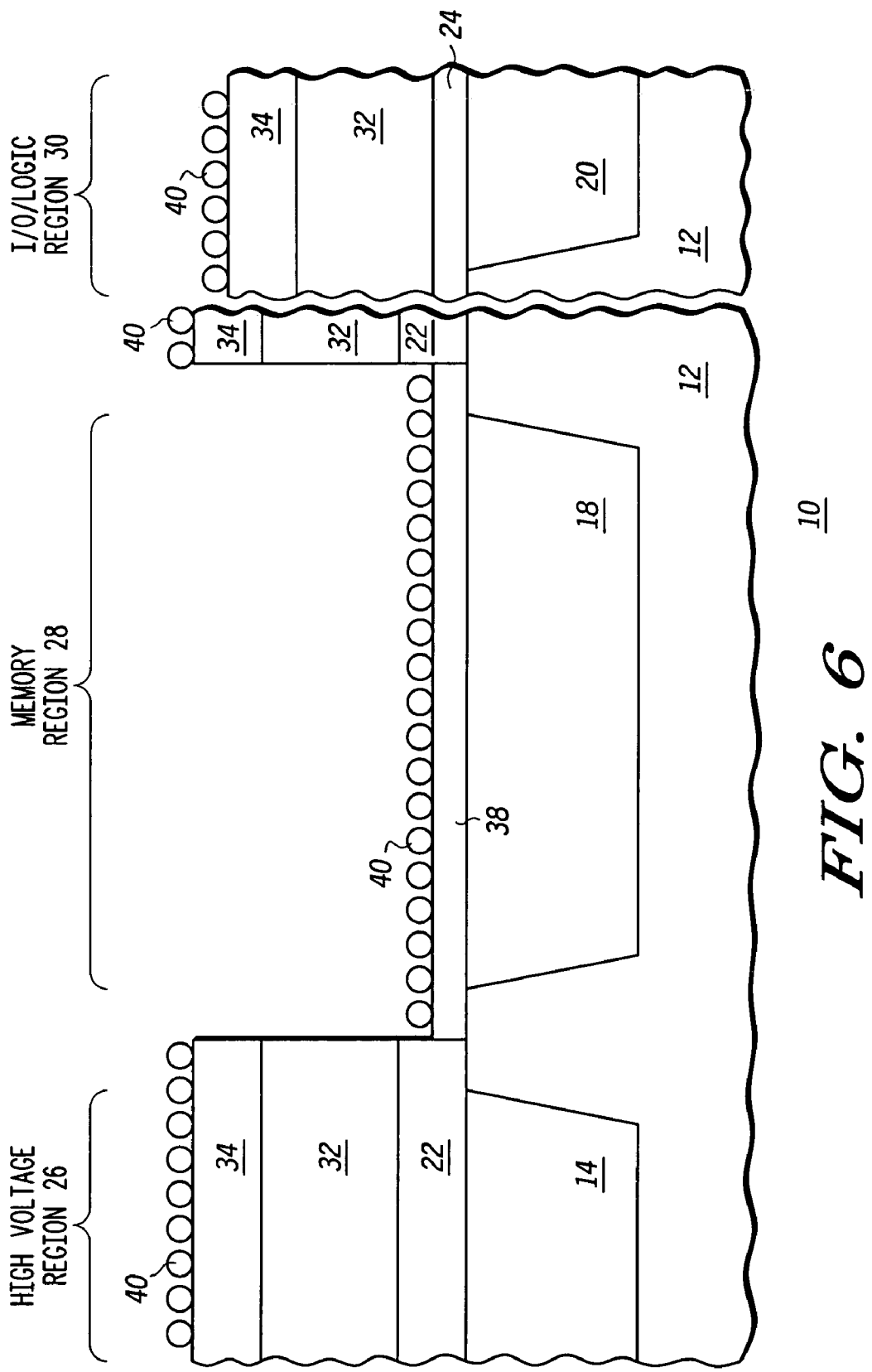

Referring to FIG. 6, a tunnel dielectric layer 38 is formed over the exposed portions of substrate 12 in memory region 28. In one embodiment, tunnel dielectric layer 38 is an oxide. In alternate embodiments, other dielectrics may be used for tunnel dielectric layer 38 such as silicon oxynitride, hafnium oxide, aluminum oxide, lanthanum oxide, or lanthanum silicate. In one embodiment, tunnel dielectric layer 38 may be formed using, for example, oxidation (e.g., in an oxygen or steam environment), CVD, molecular CVD, atomic layer deposition (ALD), or physical vapor deposition (PVD). In the illustrated embodiment, tunnel dielectric layer 38 is formed by growing an oxide over substrate 12. Therefore, in this embodiment, tunnel dielectric layer 38 is not formed over oxidation barrier layer 34. Note also that oxidation barrier layer 34 protects first gate electrode layer 32 from oxidation during formation of tunnel dielectric layer 38. However, in alternate embodiments where tunnel dielectric layer 38 is deposited, tunnel dielectric layer 38 would be formed over oxidation barrier layer 34 in regions 26 and 30 and over substrate 12 in region 28.

Still referring to FIG. 6, a layer of nanoclusters 40 (e.g. of silicon, aluminum, gold, germanium, or a silicon and germanium alloy or other types of conductive material or doped or undoped semiconductive material) is formed over oxidation barrier layer 34 and tunnel dielectric 38 by, e.g., CVD techniques, aerosol deposition techniques, spin on coating techniques, or self assembly techniques such as annealing a thin film to form nanoclusters. In one embodiment, the nanoclusters 40 are silicon nanoclusters. In one embodiment where the nanoclusters are utilized in a non-volatile memory, the nanoclusters have a planar density of $1 \times 10^{12}$ cm$^2$ with a size of 5 to 7 nanometers. In some embodiments, nanoclusters are from 1–10 nanometers in size. However the nanoclusters in other embodiments may be of other sizes and/or other densities. In one embodiment, nanoclusters 40 are separated by average distance generally equal to an average size of clusters. The average distance in one such embodiment is greater than 4 nanometers. Although nanoclusters 40 are shown as having a uniform size and distribution, nanoclusters 24 will have non-uniform sizes and a non-uniform distribution in actual practice. Nanoclusters 40 will be utilized for implementing charge storage locations in transistors (see FIG. 14) of a non-volatile memory of semiconductor device 10. Note that nanoclusters 40 may also be referred to as a nanocluster charge storage layer 40.

Figure 7:
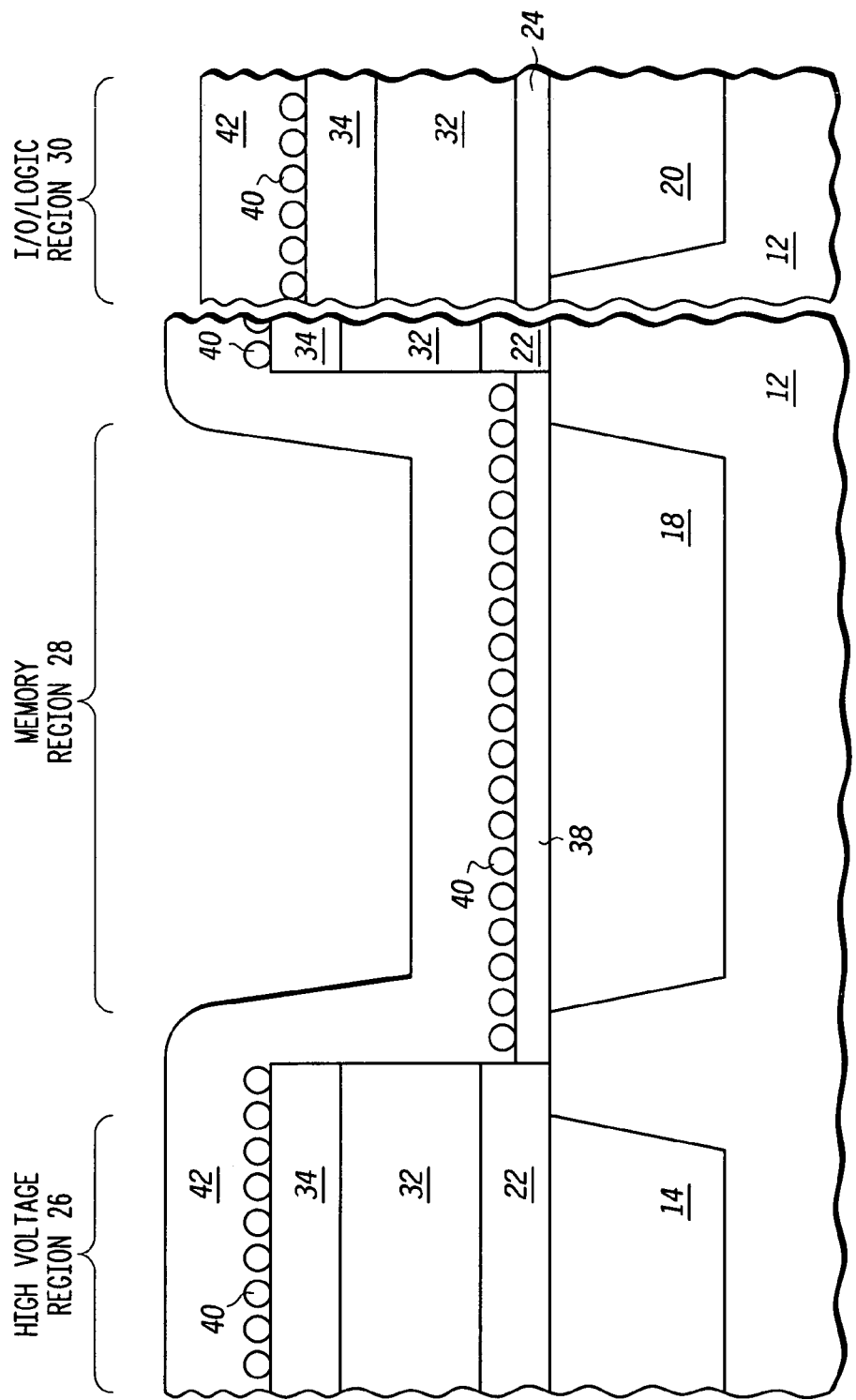

Referring to FIG. 7, after nanoclusters 40 are formed, a layer of dielectric material is formed over nanoclusters 40 (e.g., by chemical vapor deposition) to form a control dielectric layer 42. In one embodiment, control dielectric layer 42 is a silicon dioxide layer deposited over the nanoclusters, thus surrounding the nanoclusters. Alternately, other dielectrics such as silicon oxynitride, hafnium oxide, aluminum oxide, lanthanum oxide, or lanthanum silicate may be used for layer 42. In another embodiment an oxide-nitride-oxide (ONO) stack of silicon dioxide, silicon nitride, and silicon dioxide may be used for layer 42. In alternate embodiments, other materials or stack of materials may be used to form control dielectric layer 42. In one embodiment, control dielectric layer 42 has a thickness of approximately 5–10 nanometers, but may be of other thicknesses in other embodiments.

In alternate embodiments, note that tunnel dielectric layer 38, nanoclusters 40, and control dielectric layer 42 may be formed in a variety of different ways. For example, in some embodiments, tunnel dielectric layer 38, nanoclusters 40, and control dielectric layer 42 may be formed by ion implantation (e.g. silicon or germanium) into a layer of dielectric material (not shown) followed by the annealing of the ions to form nanoclusters in the layer of dielectric material. In other embodiments, tunnel dielectric layer 38, nanoclusters 40 and control dielectric layer 42 may be formed by recrystallization of a silicon rich oxide layer between two layers of dielectric material to form the nanoclusters. In other embodiments, the nanoclusters may be implemented in multiple layers located above the tunnel dielectric. In other embodiments, the nanoclusters are formed by depositing a thin amorphous layer of nanocluster material (e.g. 1–5 nanometers) where the resultant structure is annealed in a subsequent annealing process.

Figure 8:
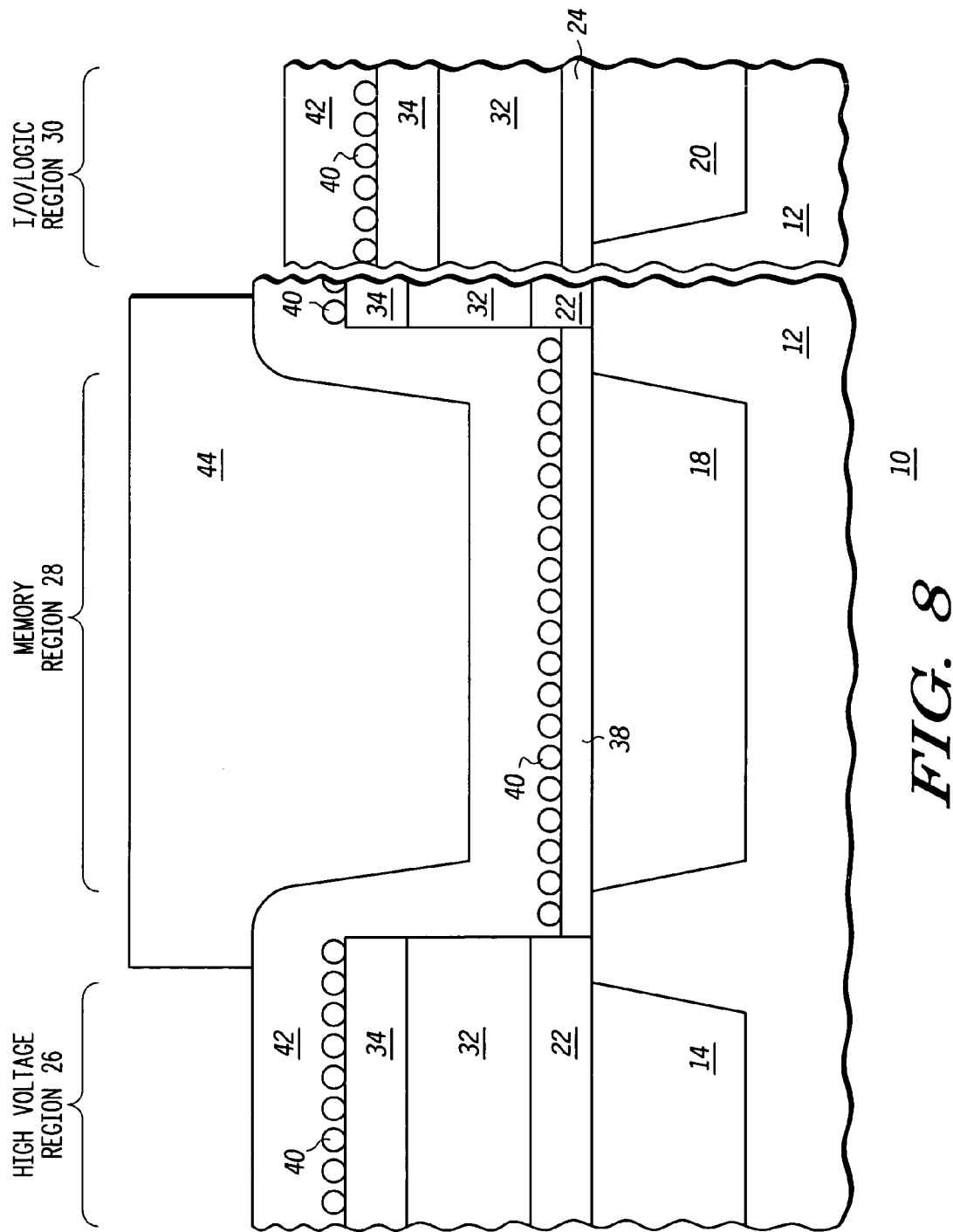
Figure 9:
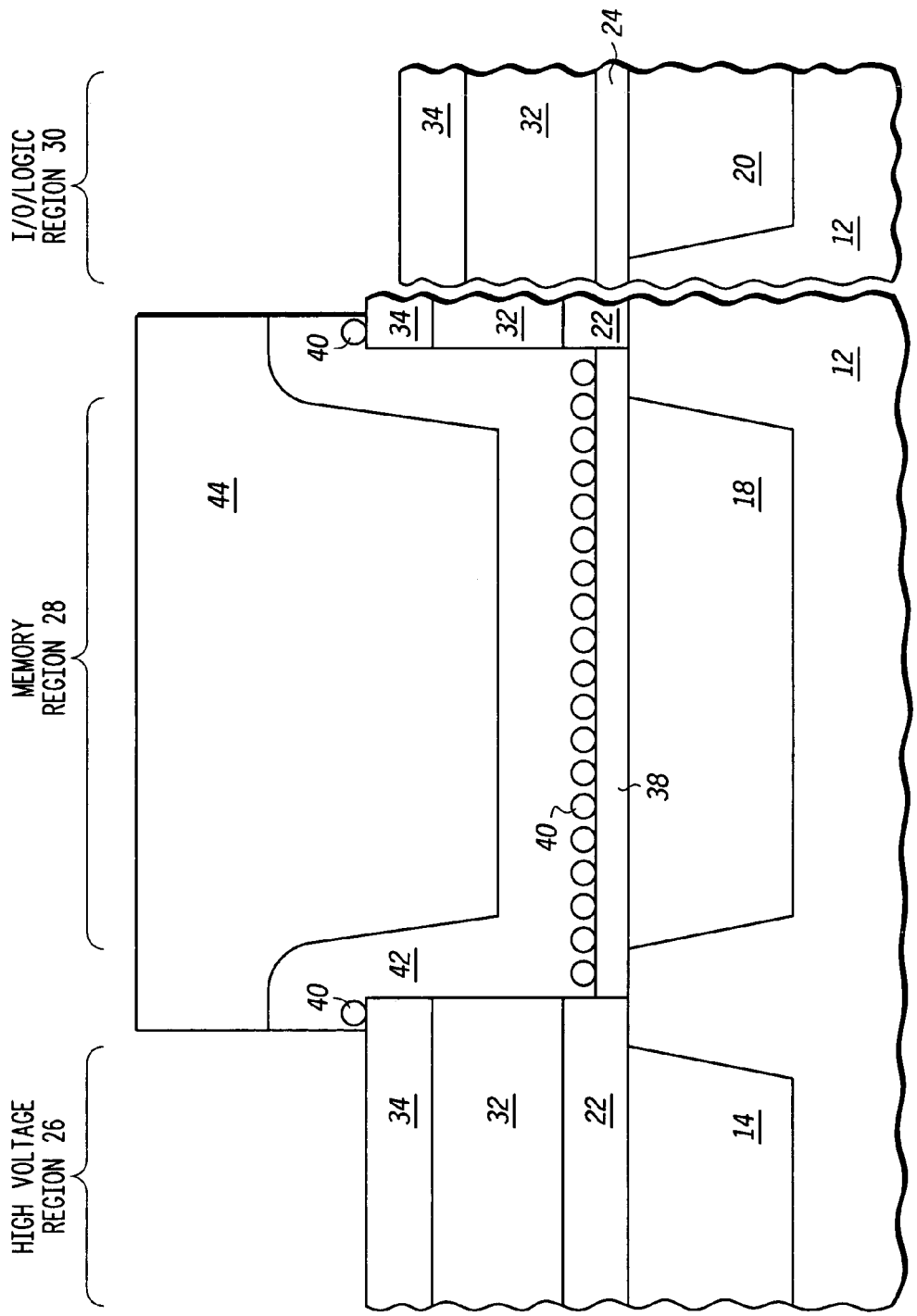

Referring to FIG. 8, a patterned masking layer 44 is formed over control dielectric layer 42, covering memory region 28 and exposing regions 26 and 30. In one embodiment, patterned masking layer 44 is a photoresist layer and may be formed using conventional techniques. Referring to FIG. 9, portions of control dielectric layer 42 and nanoclusters 40 in regions 26 and 30 (exposed by patterned masking layer 44) are removed. In one embodiment, a dry etch may be used. Alternatively, they may be removed by a wet etch which may include subsequent clean steps to remove the nanoclusters. Note that in the illustrated embodiment, oxidation barrier layer 34 also operates as an etch stop layer. In this manner, oxidation barrier layer 34 also provides an endpoint for a dry etch. (Note that in an alternate embodiment, an additional layer may be used to provide an etch stop layer.) Note that in the embodiments in which tunnel dielectric layer 38 is deposited rather than grown, tunnel dielectric layer 38 is also present over oxidation barrier layer 34 and under nanoclusters 40 in regions 26 and 30. In these embodiments, after removal of the control dielectric layer 42 and nanoclusters 40 in regions 26 and 30 (exposed by patterned masking layer 44), portions of tunnel dielectric layer 38 in these regions would also be removed.

Figure 10:
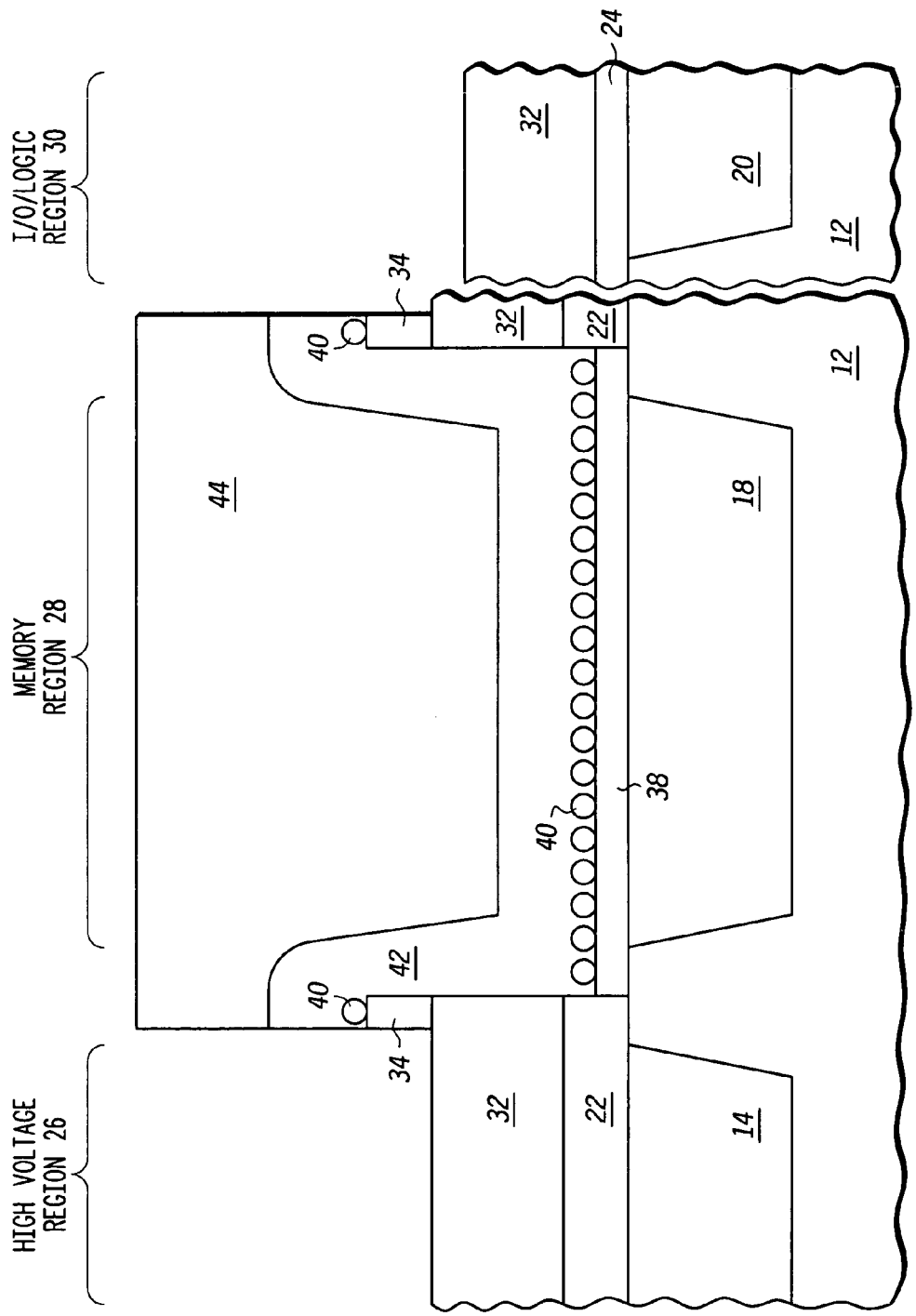
Figure 11:
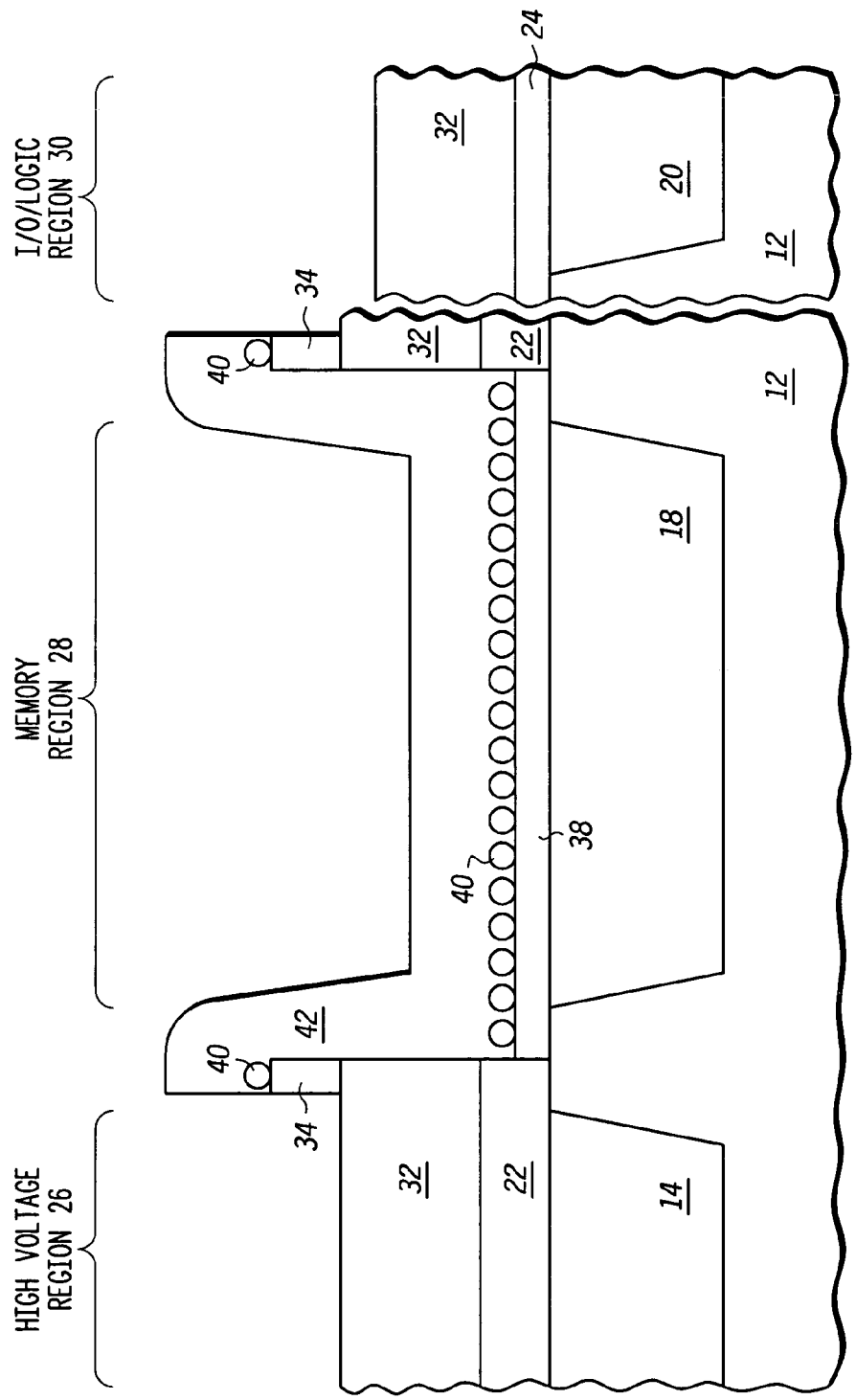

Referring to FIG. 10, portions of oxidation barrier layer 34 exposed by patterned masking layer 44 are removed using, for example, a dry etch or a wet etch. Referring to FIG. 11, patterned masking layer 44 is removed using conventional techniques. In one embodiment, prior to removing patterned masking layer 44, a hydrofluoric acid clean may be used to passivate the exposed surfaces of polysilicon layer 32 by terminating the silicon surface with hydrogen and preventing oxide growth on these exposed surfaces. In this manner, significant native oxide formation prior to the formation of subsequent layers is prevented.

Figure 12:
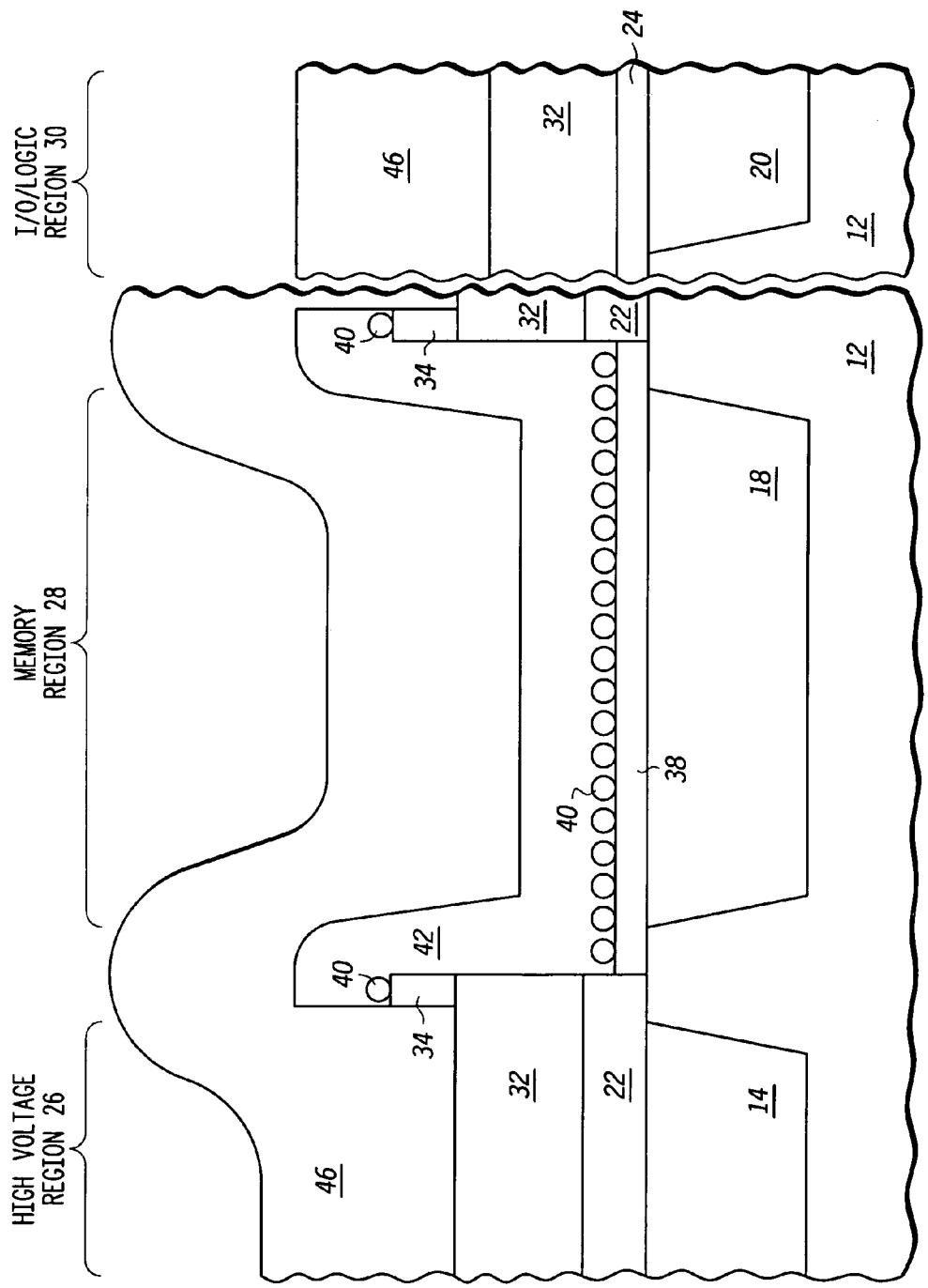

Referring to FIG. 12, a second gate electrode layer 46 is formed over first gate electrode layer 32 in regions 26 and 30 and over control dielectric layer 42 in region 28. Therefore, first gate electrode layer 32 and second gate electrode layer 46 form part of a gate stack for use in HV transistors, I/O transistors, and logic transistors within regions 26 and 30. Note that the hydrofluoric acid clean described above, if used, prevents the formation of a significant oxide layer between the first and second gate electrode layers. In another embodiment, a hydrogen bake in a high temperature (such as, for example, greater than 800 degrees Celsius) furnace can be used to remove any native oxide growth prior to formation of second gate electrode layer 46. In one embodiment, second gate electrode layer 46 is formed of the same material as first gate electrode layer 32. Alternatively, they may be different materials. In one embodiment, second gate electrode layer 46 is a polysilicon layer. Alternatively, second gate electrode layer 46 may include a silicided polysilicon material.

Figure 13:
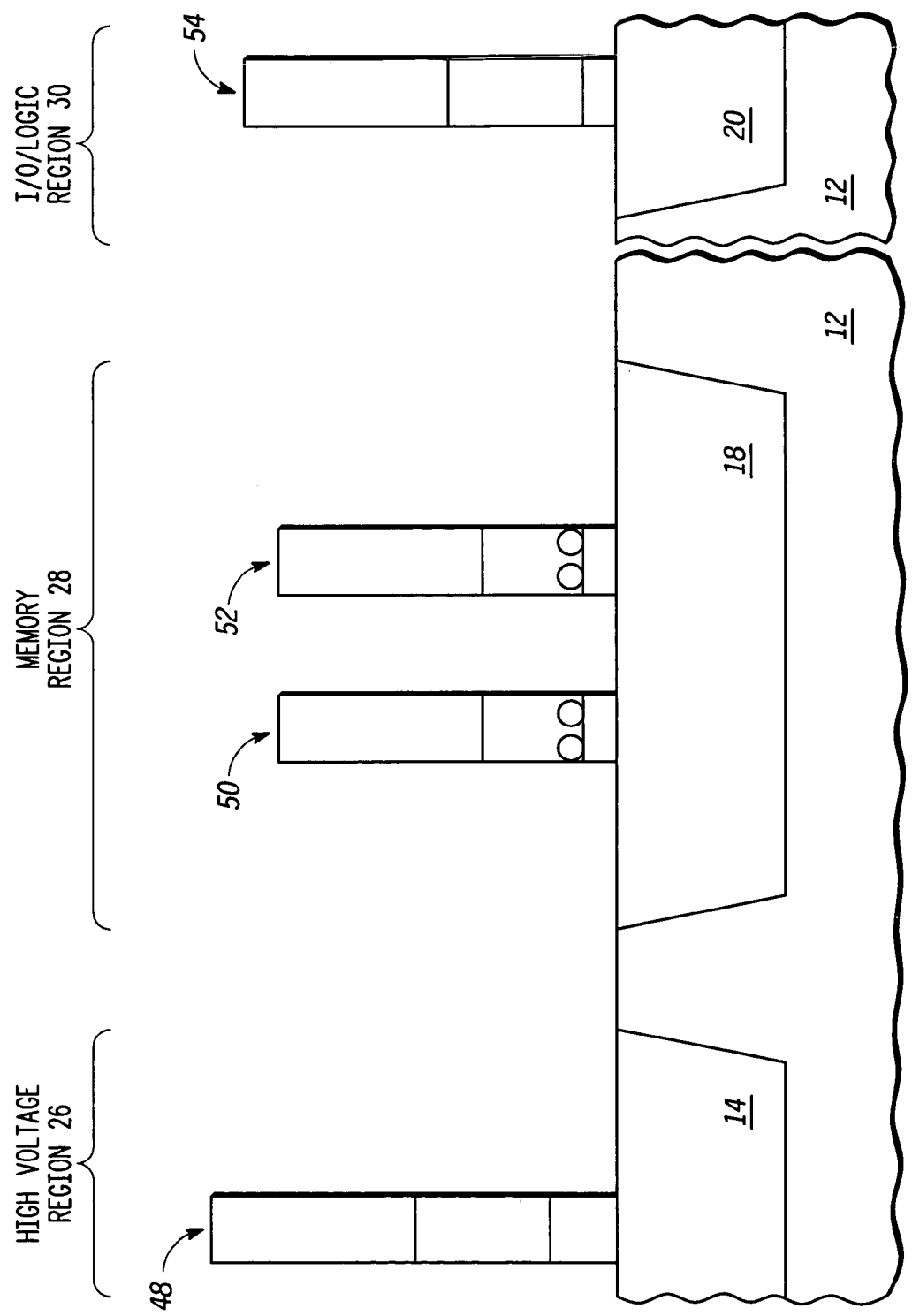

Referring to FIG. 13, patterning and etching techniques are used to form gate stacks 48, 50, 52, and 54, where gate stack 48 is within region 26, gate stacks 50 and 52 are within region 28, and gate stack 54 is within region 30. For example, conventional masking techniques followed by a removal of the various portions of layers exposed by the masking layer (e.g. via an anisotropic plasma etch) may be used to form the gate stacks. Note that the gate stacks within region 28 include nanoclusters while those in the periphery regions (e.g. regions 26 and 30) do not. Also, note that since the gate oxides of gate stacks 48 and 54 were formed prior to the formation of the nanoclusters of gate stacks 50 and 52, the nanoclusters are not consumed during this gate oxide formation. In one embodiment, the etching to form gate stacks 48, 50, 52, and 54 may performed simultaneously. Alternatively, gate stacks 50 and 52 may be formed prior to or after formation of gate stacks 48 and 54. Note also that in alternate embodiments, additional layers may be included in each of gate stacks 48, 50, 52, and 54. For example, each gate stack may include an anti-reflective coating (ARC) over the second gate electrode layer. Alternatively, other or additional layers may be included.

Figure 14:
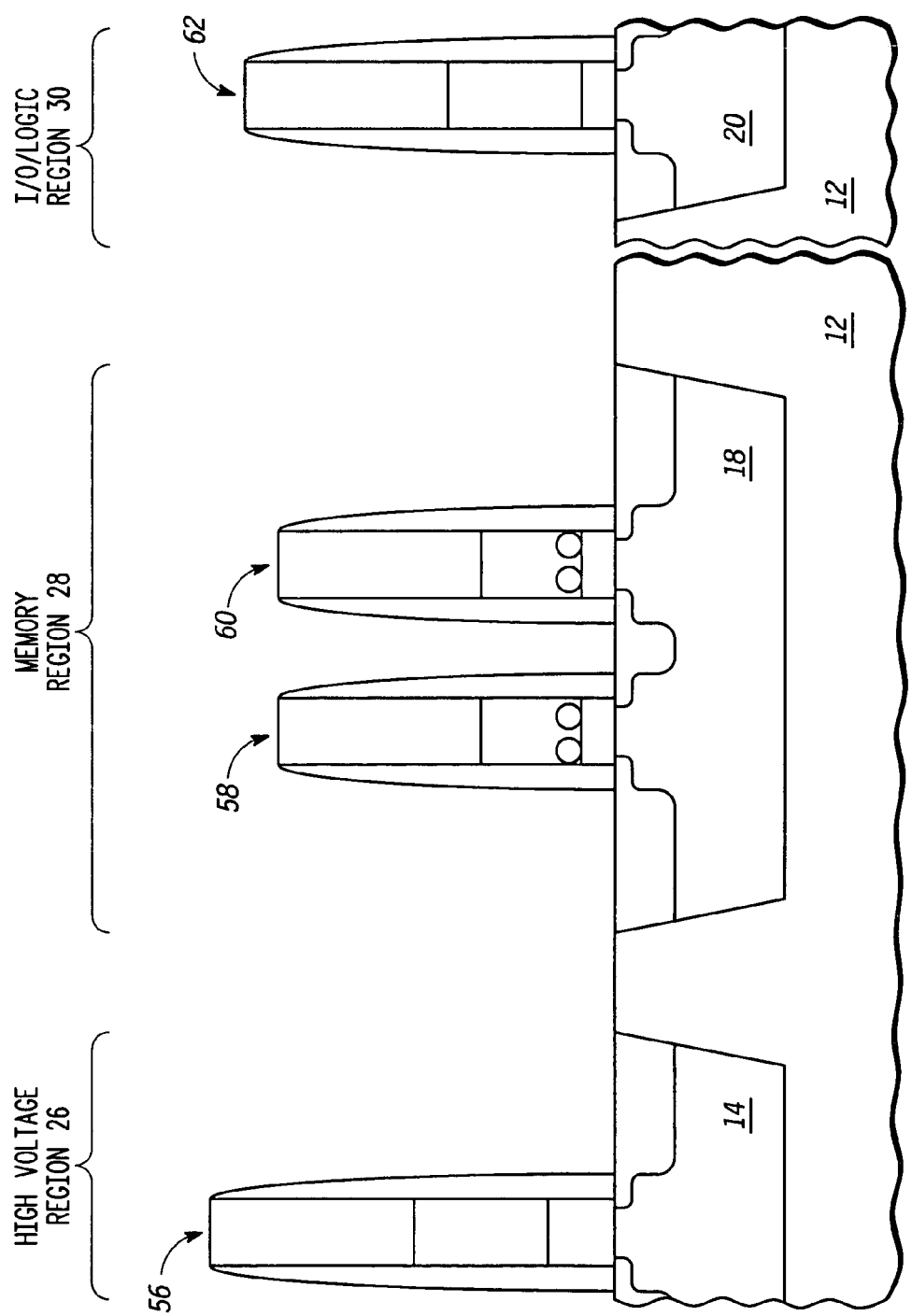

Referring to FIG. 14, conventional processing may be used to form substantially completed devices, such as NVM transistors 58 and 60 and periphery transistors 56 and 62. Subsequent to the formation of gate stacks 56, 58, 60, and 62, standard CMOS processing techniques are used to form source/drain extensions, side-wall spacers and source/drain regions. Note that in alternate embodiments, any number of devices may be formed. Also, in the illustrated embodiment, transistors 58 and 60 share a common source/drain region; however, in alternate embodiments, each transistor may have its own source/drain region.

Therefore, it can be appreciated how the formation of the gate oxides for the HV transistors prior to the formation of the nanocluster charge storage layer for memory transistors may allow for improved integration of memory and periphery transistors. That is, since the nanoclusters are formed after growth of the high voltage gate oxide, the nanoclusters are not exposed to the oxidizing ambient which could potentially reduce their size and increase the thickness of the underlying tunnel dielectric layer (e.g. layer 38). Also, note that in one embodiment, the control dielectric layer (e.g. layer 42) within the memory region is not exposed to any etch agents. In this manner, an extra sacrificial layer to protect the underlying nanoclusters is not needed. Also, in the illustrated embodiment, removal of the nanoclusters from the periphery areas of the wafer (e.g., regions 26 and 30) is facilitated by the implementation of oxidation barrier/etch stop layer 34.

The above description is intended to describe at least one embodiment of the invention. The above description is not intended to define the scope of the invention. Rather, the scope of the invention is defined in the claims below. Thus, other embodiments of the invention include other variations, modifications, additions, and/or improvements to the above description.

In one embodiment, a method of forming a nanocluster charge storage device is provided. A first region of a semiconductor device is identified for locating one or more non-charge storage devices. A second region of the semiconductor device is identified for locating one or more charge storage devices. A gate oxide to be used as a gate insulator of the one or more non-charge storage devices is formed in the first region of the semiconductor device, and a nanocluster charge storage layer is subsequently formed in the second region of the semiconductor device.

In a further embodiment, the first region is identified as a region for forming high voltage transistors having a gate oxide thickness of at least five nanometers. In another further embodiment, non-charge storage transistors are formed in the first region and charge storage transistors are formed in the second region after forming the nanocluster charge storage layer in the second region of the semiconductor device. In another further embodiment, a third region of the semiconductor device is identified as a region for forming one or more input/output transistors or logic transistors or a combination thereof, the third region for locating one or more non-charge storage transistors having a gate oxide that is smaller in thickness than the gate oxide of the one or more non-charge storage devices in the first region.

In another further embodiment, a gate electrode layer and an overlying gate oxidation barrier layer is formed over the non-charge storage devices after formation of the gate oxide and prior to forming the nanocluster charge storage layer in both the first region of the semiconductor device and the second region of the semiconductor device. The nanocluster charge storage layer is removed from the first region of the semiconductor device by using the oxidation barrier layer to protect the gate electrode layer in the first region of the semiconductor device.

In another further embodiment, a substrate is provided. The gate oxide is formed overlying the substrate and within both the first region of the semiconductor device and the second region of the semiconductor device. At least one well region in each of the first region of the semiconductor device and the second region of the semiconductor device is implanted. A gate electrode layer of material is formed within at least the first region of the semiconductor device, and a nitride layer is formed overlying the gate electrode layer of material. The gate electrode layer of material and the nitride layer within the first region of the semiconductor device are patterned, and the gate electrode layer of material, the nitride layer and the gate oxide from the second region of the semiconductor device are removed. A memory gate oxide is formed within the second region of the semiconductor device, and the nanocluster charge storage layer is formed in both the first region of the semiconductor device and the second region of the semiconductor device. A control dielectric is formed surrounding the nanocluster charge storage layer. The nanocluster charge storage layer and the control dielectric in the first region of the semiconductor device are removed, and the remaining portions of the nitride layer are removed. Formation of predetermined gate stacks are completed within the first region of the semiconductor device and the second region of the semiconductor device, and formation of the non-charge storage devices and the charge storage devices are completed to form transistors within both the first region of the semiconductor device and the second region of the semiconductor device. In yet a further embodiment, a third region of the semiconductor device is identified for formation of transistors having a smaller gate oxide thickness than transistors in the first region of the semiconductor device. The transistors in the third region of the semiconductor device are formed using the same processing steps as used to form the non-charge storage devices in the first region of the semiconductor device.

In another embodiment, a method of forming a nanocluster charge storage devices includes providing a substrate, identifying a first region overlying the substrate for locating one or more non-charge storage devices, identifying a second region overlying the substrate for locating one or more charge storage devices, forming a gate oxide in both the first region and the second region where the gate oxide functions as a gate insulator of the one or more non-charge storage devices in the first region of the semiconductor device, forming a gate material layer overlying the gate oxide, forming an oxidation barrier layer overlying the gate material layer, removing the oxidation barrier layer, the gate material layer and the gate oxide from the second region, forming a charge storage device gate oxide in the second region where the charge storage device gate oxide has a thickness that is less than the gate oxide, forming a nanocluster charge storage layer and a control dielectric in both the first region and the second region, removing the nanocluster charge storage layer and the control dielectric from the first region while using the oxidation barrier layer to protect the gate material in the first region, and completing formation of transistors in the first region and the second region.

In a further embodiment, the method further includes implementing high voltage transistors in the first region by forming the gate oxide in the first region with a thickness of at least five nanometers. The high voltage transistors in the first region perform at least one of programming, erasing, or reading the charge storage transistors in the second region.

In another further embodiment, the method further includes forming one or more well regions within each of the first region and the second region, and forming gate electrodes of the transistors in the second region with two depositions of gate material that are separated in time.

In another further embodiment, the method further includes identifying a third region overlying the substrate for locating one or more non-charge storage devices having electrical properties that differ from the one or more non-charge storage devices within the first region. In yet a further embodiment, the method further includes forming transistors in the third region that implement input/output functions or logic functions or a combination of both. In yet another further embodiment, the method further includes implementing the one or more non-charge storage devices with a gate oxide having a thickness that is substantially a same thickness as the charge storage device gate oxide in the second region or less than a thickness of the charge storage device gate oxide in the second region.

In another further embodiment, the method further includes removing the oxidation barrier layer prior to completing formation of transistors in the first region and the second region.

In yet another embodiment, a method of forming a nanocluster charge storage device includes providing a substrate, forming a high voltage gate oxide overlying the substrate and within both a high voltage device region and a memory device region, forming a gate electrode layer of material overlying the high voltage device region and the memory device region, forming an oxidation barrier layer overlying the gate electrode layer of material, removing the oxidation barrier layer, the gate electrode layer of material and the high voltage gate oxide from the memory device region, forming a memory gate oxide within the memory device region of the semiconductor device, forming a nanocluster charge storage layer in both the high voltage device region and the memory device region overlying the high voltage gate oxide and the memory gate oxide, forming a control dielectric surrounding the nanocluster charge storage layer, and removing the nanocluster charge storage layer and the control dielectric in the high voltage device region while using the oxidation barrier layer to prevent oxidation of the gate electrode layer of material.

In a further embodiment, the method further includes removing remaining portions of the oxidation barrier layer.

In another further embodiment, the method further includes completing formation of predetermined gate stacks within the high voltage device region and the memory device region, and completing formation of non-charge storage devices in the high voltage device region and charge storage devices in the memory device region to form transistors within both regions.

In another further embodiment, the method further includes implanting at least one well region in each of the high voltage device region and the memory region.

In another further embodiment, the method further includes forming the memory gate oxide thinner than the high voltage gate oxide. In yet a further embodiment, the method further includes forming the high voltage gate oxide with a thickness of at least five nanometers or greater.

Many of the devices described herein may be conceptualized as having a control terminal which controls the flow of current between a first current handling terminal and a second current handling terminal. One example of such a device is a transistor. An appropriate condition on the control terminal of a transistor causes a current to flow from/to the first current handling terminal and to/from the second current handling terminal. Also, although field effect transistors (FETs) are frequently discussed as having a drain, a gate, and a source, in most such devices the drain is interchangeable with the source. This is because the layout and semiconductor processing of the transistor is frequently symmetrical.

Because the above detailed description is exemplary, when "one embodiment" is described, it is an exemplary embodiment. Accordingly, the use of the word "one" in this context is not intended to indicate that one and only one embodiment may have a described feature. Rather, many other embodiments may, and often do, have the described feature of the exemplary "one embodiment." Thus, as used above, when the invention is described in the context of one embodiment, that one embodiment is one of many possible embodiments of the invention.

Notwithstanding the above caveat regarding the use of the words "one embodiment" in the detailed description, it will be understood by those within the art that if a specific number of an introduced claim element is intended in the below claims, such an intent will be explicitly recited in the claim, and in the absence of such recitation no such limitation is present or intended. For example, in the claims below, when a claim element is described as having "one" feature, it is intended that the element be limited to one and only one of the feature described. Furthermore, when a claim element is described in the claims below as including or comprising "a" feature, it is not intended that the element be limited to one and only one of the feature described. Rather, for example, the claim including "a" feature reads upon an apparatus or method including one or more of the feature in question. That is, because the apparatus or method in question includes a feature, the claim reads on the apparatus or method regardless of whether the apparatus or method includes another such similar feature. This use of the word "a" as a nonlimiting, introductory article to a feature of a claim is adopted herein by Applicants as being identical to the interpretation adopted by many courts in the past, notwithstanding any anomalous or precedential case law to the contrary that may be found. Similarly, when a claim element is described in the claims below as including or comprising an aforementioned feature (e.g., "the" feature), it is intended that the element not be limited to one and only one of the feature described merely by the incidental use of the definite article.

Furthermore, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Based on the teachings herein, those skilled in the art will readily implement the steps necessary to provide the structures and the methods disclosed herein, and will understand that the process parameters, materials, dimensions, and sequence of steps are given by way of example only and can be varied to achieve the desired structure as well as modifications that are within the scope of the invention. Variations and modifications of the embodiments disclosed herein may be made based on the description set forth herein, without departing from the spirit and scope of the invention as set forth in the following claims.

While particular embodiments of the present invention have been shown and described, it will be obvious to those skilled in the art that, based upon the teachings herein, various modifications, alternative constructions, and equivalents may be used without departing from the invention claimed herein. Consequently, the appended claims encompass within their scope all such changes, modifications, etc. as are within the true spirit and scope of the invention. Furthermore, it is to be understood that the invention is solely defined by the appended claims. The above description is not intended to present an exhaustive list of embodiments of the invention. Unless expressly stated otherwise, each example presented herein is a nonlimiting or nonexclusive example, whether or not the terms nonlimiting, nonexclusive or similar terms are contemporaneously expressed with each example. Although an attempt has been made to outline some exemplary embodiments and exemplary variations thereto, other embodiments and/or variations are within the scope of the invention as defined in the claims below.

What is claimed is:

1. A method of forming a nanocluster charge storage device, comprising:
    identifying a first region of a semiconductor device for locating one or more non-charge storage devices;
    identifying a second region of the semiconductor device for locating one or more charge storage devices;
    forming a gate oxide to be used as a gate insulator of the one or more non-charge storage devices in the first region of the semiconductor device;
    subsequently forming a nanocluster charge storage layer in the second region of the semiconductor device
    forming a gate electrode layer and an overlying barrier layer over the non-charge storage devices after formation of the gate oxide and prior to forming the nanocluster charge storage layer in both the first region of the semiconductor device and the second region of the semiconductor device; and
    removing the nanocluster charge storage layer from the first region of the semiconductor device by using the barrier layer to protect the gate electrode layer in the first region of the semiconductor device.

2. The method of claim 1 further comprising:
    identifying the first region of the semiconductor device as a region for forming high voltage transistors having a gate oxide thickness of at least five nanometers.

3. The method of claim 1 further comprising:
    forming non-charge storage transistors in the first region and forming charge storage transistors in the second region after forming the nanocluster charge storage layer in the second region of the semiconductor device.

4. The method of claim 1 further comprising:
    identifying a third region of the semiconductor device as a region for forming one or more input/output transistors or logic transistors or a combination thereof, the third region for locating one or more non-charge storage transistors having a gate oxide that is smaller in thickness than the gate oxide of the one or more non-charge storage devices in the first region.

5. A method of forming a nanocluster charge storage device, comprising:
    identifying a first region of a semiconductor device for locating one or more non-charge storage devices;
    identifying a second region of the semiconductor device for locating one or more charge storage devices;
    forming a gate oxide to be used as a gate insulator of the one or more non-charge storage devices in the first region of the semiconductor device;
    subsequently forming a nanocluster charge storage layer in the second region of the semiconductor device;
    providing a substrate;
    forming the gate oxide overlying the substrate and within both the first region of the semiconductor device and the second region of the semiconductor device;
    implanting at least one well region in each of the first region of the semiconductor device and the second region of the semiconductor device;
    forming a gate electrode layer of material within at least the first region of the semiconductor device;
    forming a barrier layer overlying the gate electrode layer of material;
    patterning the gate electrode layer of material and the nitride barrier layer within the first region of the semiconductor device;
    removing the gate electrode layer of material, the barrier layer and the gate oxide from the second region of the semiconductor device;
    forming a memory gate oxide within the second region of the semiconductor device;
    forming the nanocluster charge storage layer in both the first region of the semiconductor device and the second region of the semiconductor device;
    forming a control dielectric surrounding the nanocluster charge storage layer;
    removing the nanocluster charge storage layer and the control dielectric in the first region of the semiconductor device;
    removing remaining portions of the barrier layer;
    completing formation of predetermined gate stacks within the first region of the semiconductor device and the second region of the semiconductor device; and
    completing formation of the non-charge storage devices and the charge storage devices to form transistors within both the first region of the semiconductor device and the second region of the semiconductor device.

6. The method of claim 5 further comprising:
    identifying a third region of the semiconductor device for formation of transistors having a smaller gate oxide thickness than transistors in the first region of the semiconductor device; and
    forming transistors in the third region of the semiconductor device using the same processing steps as used to form the non-charge storage devices in the first region of the semiconductor device.

7. A method of forming a nanocluster charge storage devices comprising:
    providing a substrate;
    identifying a first region overlying the substrate for locating one or more non-charge storage devices;
    identifying a second region overlying the substrate for locating one or more charge storage devices;
    forming a gate oxide in both the first region and the second region, the gate oxide functioning as a gate insulator of the one or more non-charge storage devices in the first region of the semiconductor device;
    forming a gate material layer overlying the gate oxide;

forming an oxidation barrier layer overlying the gate material layer;

removing the oxidation barrier layer, the gate material layer and the gate oxide from the second region;

forming a charge storage device gate oxide in the second region, the charge storage device gate oxide having a thickness that is less than the gate oxide;

forming a nanocluster charge storage layer and a control dielectric in both the first region and the second region;

removing the nanocluster charge storage layer and the control dielectric from the first region while using the oxidation barrier layer to protect the gate material in the first region; and completing formation of transistors in the first region and the second region.

8. The method of claim 7 further comprising:

implementing high voltage transistors in the first region by forming the gate oxide in the first region with a thickness of at least five nanometers in order to have higher gate voltage capability than transistors in the second region.

9. The method of claim 7 further comprising:

forming one or more well regions within each of the first region and the second region; and forming gate electrodes of the transistors in the second region with two depositions of gate material that are separated in time.

10. The method of claim 7 further comprising:

identifying a third region overlying the substrate for locating one or more non-charge storage devices having electrical properties that differ from the one or more non-charge storage devices within the first region.

11. The method of claim 10 further comprising:

forming transistors in the third region that implement input/output functions or logic functions or a combination of both.

12. The method of claim 10 further comprising:

implementing the one or more non-charge storage devices with a gate oxide having a thickness that is substantially a same thickness as the charge storage device gate oxide in the second region.

13. The method of claim 7 further comprising:

removing the oxidation barrier layer prior to completing formation of transistors in the first region and the second region.

14. A method of forming a nanocluster charge storage device comprising:

providing a substrate;

forming a high voltage gate oxide overlying the substrate and within both a high voltage device region and a memory device region;

forming a gate electrode layer of material overlying the high voltage device region and the memory device region;

forming an oxidation barrier layer overlying the gate electrode layer of material;

removing the oxidation barrier layer, the gate electrode layer of material and the high voltage gate oxide from the memory device region;

forming a memory gate oxide within the memory device region of the semiconductor device;

forming a nanocluster charge storage layer in both the high voltage device region and the memory device region overlying the high voltage gate oxide and the memory gate oxide;

forming a control dielectric surrounding the nanocluster charge storage layer; and removing the nanocluster charge storage layer and the control dielectric in the high voltage device region while using the oxidation barrier layer to prevent oxidation of the gate electrode layer of material.

15. The method of claim 14 further comprising:

removing remaining portions of the oxidation barrier layer.

16. The method of claim 14 further comprising:

completing formation of predetermined gate stacks within the high voltage device region and the memory device region; and completing formation of non-charge storage devices in the high voltage device region and charge storage devices in the memory device region to form transistors within both regions.

17. The method of claim 14 further comprising:

implanting at least one well region in each of the high voltage device region and the memory region.

18. The method of claim 14 further comprising:

forming the memory gate oxide thinner than the high voltage gate oxide.

19. The method of claim 18 further comprising:

forming the high voltage gate oxide with a thickness of at least five nanometers or greater.

* * * * *